US009765428B2

(12) United States Patent
Han

(10) Patent No.: US 9,765,428 B2
(45) Date of Patent: Sep. 19, 2017

(54) APPARATUS FOR DEPOSITION AND SUBSTRATE ALIGNMENT METHOD IN THE SAME

(71) Applicant: SAMSUNG DISPLAY CO., LTD., Yongin, Gyeonggi-Do (KR)

(72) Inventor: Jeong Won Han, Seongnam-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 161 days.

(21) Appl. No.: 14/747,412

(22) Filed: Jun. 23, 2015

(65) Prior Publication Data

US 2016/0186317 A1    Jun. 30, 2016

(30) Foreign Application Priority Data

Dec. 26, 2014  (KR) .......................... 10-2014-0191114

(51) Int. Cl.
  *C23C 16/00*  (2006.01)
  *C23C 16/04*  (2006.01)
  *C23C 14/04*  (2006.01)

(52) U.S. Cl.
  CPC .......... *C23C 16/042* (2013.01); *C23C 14/042* (2013.01)

(58) Field of Classification Search
  CPC ....... C23C 16/042; C23C 14/22–14/32; C23C 16/448–16/4488
  USPC ................................................. 118/726, 727
  See application file for complete search history.

(56) References Cited

U.S. PATENT DOCUMENTS

| 5,534,969 A * | 7/1996 | Miyake .................. G03F 7/707 250/559.3 |
| 2004/0142108 A1* | 7/2004 | Atobe ................... C23C 14/042 427/282 |
| 2004/0163592 A1* | 8/2004 | Abiko ................... C23C 14/042 118/715 |
| 2007/0052914 A1* | 3/2007 | Ito ......................... G02F 1/1303 349/190 |
| 2009/0041980 A1* | 2/2009 | Miyashita ........... H01L 21/6831 428/138 |

FOREIGN PATENT DOCUMENTS

| JP | 2002-064134 A | 2/2002 |
| JP | 2004-235563 A | 8/2004 |
| JP | 2009-167471 A | 7/2009 |
| JP | 2014-065959 A | 4/2014 |
| KR | 10-2009-0108420 A | 10/2009 |
| KR | 10-1307153 B1 | 9/2013 |
| KR | 10-1310336 B1 | 9/2013 |

\* cited by examiner

*Primary Examiner* — Keath Chen
(74) *Attorney, Agent, or Firm* — Lee & Morse, P.C.

(57) ABSTRACT

A deposition apparatus includes a sheet, an edge portion of which is integrally combined with a sheet frame, an electrostatic chuck attached to a bottom surface of the sheet, the electrostatic chuck adhering a substrate by a force of static electricity, a metal mask located below the electrostatic chuck, an edge portion of the metal mask being combined with a mask frame, the metal mask having a predetermined patterned opening, and the substrate being mounted to the upper surface of the metal mask, a transfer member coupled to a side surface of the sheet frame, the transfer member flattening the sheet by pulling the sheet to side directions, and a magnetic plate located above the sheet, the magnetic plate closely attaching the substrate to the electrostatic chuck by pulling the metal mask using a magnetic force.

13 Claims, 16 Drawing Sheets

US 9,765,428 B2

APPARATUS FOR DEPOSITION AND SUBSTRATE ALIGNMENT METHOD IN THE SAME

CROSS-REFERENCE TO RELATED APPLICATION

Korean Patent Application No. 10-2014-0191114, filed on Dec. 26, 2014, in the Korean Intellectual Property Office, and entitled: "Apparatus for Deposition and Substrate Alignment Method in the Same," is incorporated by reference herein in its entirety.

BACKGROUND

Embodiments relate to a deposition apparatus, such as a deposition apparatus for deposition of an organic material on a substrate, and a method for aligning a substrate in the deposition apparatus.

SUMMARY

Embodiments are directed to a deposition apparatus including a sheet, an edge portion of which is integrally combined with a sheet frame, an electrostatic chuck attached to a bottom surface of the sheet, the electrostatic chuck adhering a substrate by a force of static electricity, a metal mask located below the electrostatic chuck, an edge portion of the metal mask being combined with a mask frame, the metal mask having a predetermined patterned opening, and the substrate being mounted to the upper surface of the metal mask, a transfer member coupled to a side surface of the sheet frame, the transfer member flattening the sheet by pulling the sheet to side directions, and a magnetic plate located above the sheet, the magnetic plate closely attaching the substrate to the electrostatic chuck by pulling the metal mask using a magnetic force.

The deposition apparatus may further include a sheet frame driver that transfers the sheet frame in an upward or downward direction and a magnetic plate driver that transfers the magnetic plate in an upward or downward direction.

The electrostatic chuck may be in a form of a film.

The sheet and the electrostatic chuck attached to the sheet may be bent convexly in a downward direction.

The sheet may be made of a metal or a polymer material.

The magnetic plate may be a permanent magnet or an electromagnet.

The metal mask may be a fine metal mask.

The transfer member may include a ball screw rotatably coupled to a side surface of the sheet frame and a motor coupled to the ball screw to rotate the ball screw.

The sheet frame may be provided as plural sheet frames. The sheet frames may each be attached to one of a plurality of spots of an edge portion of the sheet.

Each of the sheet frames may be moveable in a plurality of directions.

Each of the sheet frames may have a different size.

Embodiments are also directed to a substrate aligning method including mounting a substrate to a metal mask, an edge portion of the metal mask being combined with a mask frame, attaching the substrate to an electrostatic chuck by moving a sheet to which the electrostatic chuck is attached in a direction toward the metal mask, the sheet including an edge portion integrally combined with a sheet frame, flattening the sheet, the electrostatic chuck, and the substrate by moving the sheet frame to pull the edge portion of the sheet in an outward direction, and moving a magnetic plate located above the sheet in a downward direction toward the metal mask to closely attach the substrate to the metal mask using a magnetic force.

Embodiments are also directed to a substrate aligning method including mounting a substrate to a metal mask, an edge portion of the metal mask being combined with a mask frame, attaching the substrate to an electrostatic chuck by moving a sheet to which the electrostatic chuck is attached in a downward direction toward the metal mask, an edge portion of the sheet being integrally combined with a sheet frame, moving the sheet in an upward direction while the substrate is attached to the electrostatic chuck, flattening the sheet, the electrostatic chuck, and the substrate by moving the sheet frame to pull the edge portion of the sheet in an outward direction, and closely attaching the substrate to the metal mask using a magnetic force by moving a magnetic plate located above the sheet in a downward direction toward the metal mask.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
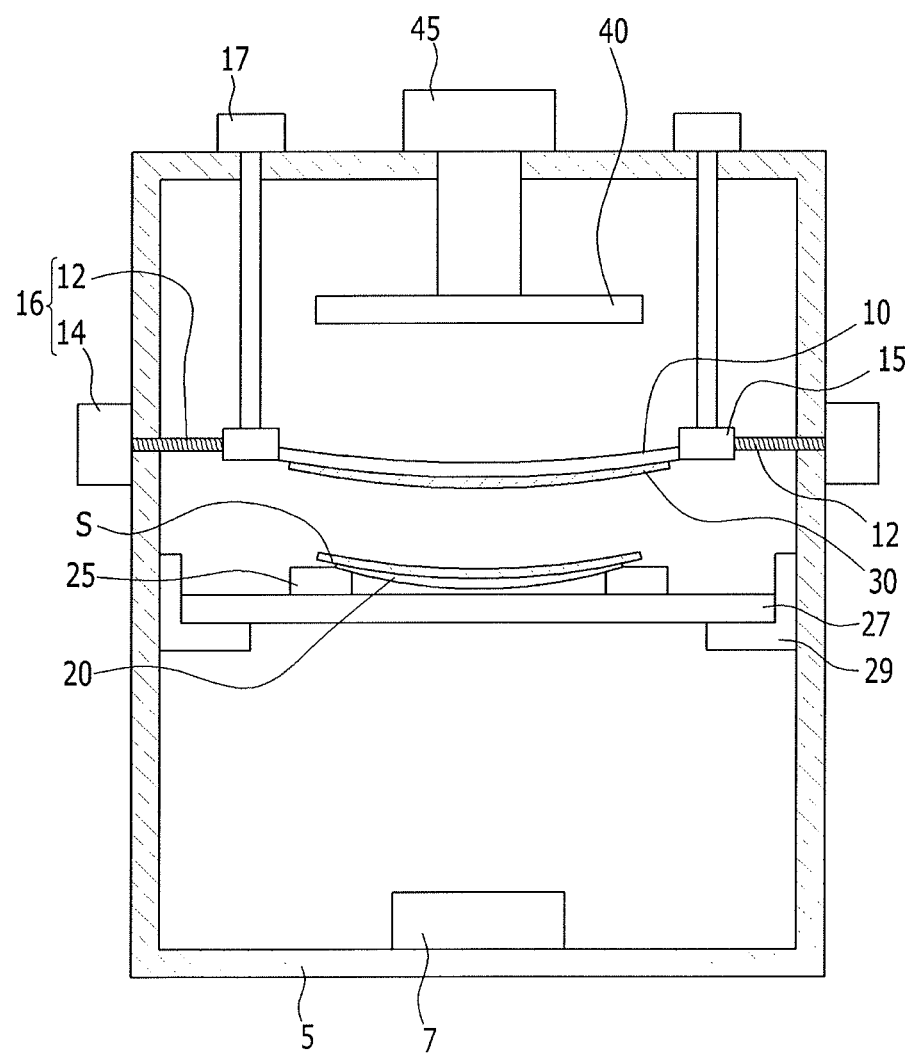
FIG. 1 schematically illustrates a deposition device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Hereinafter, a deposition apparatus according to an exemplary embodiment will be described with reference to FIG. 1.

FIG. 1 schematically illustrates a deposition apparatus according to an exemplary embodiment. Referring to FIG. 1, a deposition apparatus 100 may include a sheet 10 in a vacuum deposition chamber 5, an electrostatic chuck 30 attached to a bottom surface of the sheet 10, a metal mask 20 provided in a lower portion of the electrostatic chuck 30, transfer members 16 coupled to side surfaces of a sheet frame 15, a magnetic plate 40 provided in an upper side of the sheet 10, and a deposition material supply source 7 provided in a lower side of the metal mask 20 and supplying a deposition material to the metal mask 20. Herein, terms such as "upper," "lower," "up," "down," "upward," "downward," "bottom," etc. may be understood, for example, relative to a deposition apparatus 100 as illustrated in FIG. 1.

In detail, the vacuum deposition chamber 5 limits a space where a process is performed. The sheet 10, the electrostatic chuck 30, the transfer members 16, the magnetic plate 40, and the deposition material supply source are provided in the vacuum deposition chamber 5.

The sheet 10 may be integrally coupled with the sheet frame 15 at an edge portion of the sheet 10. The sheet frame 15 may be connected with a sheet driver 17 provided at an outer side of the vacuum deposition chamber 5. The sheet frame 15 may be moved in an upward or downward direction by the sheet driver 17. The sheet 10 may be made of a metal or a polymer material.

The electrostatic chuck 30 may be attached to the bottom surface of the sheet 10.

The electrostatic chuck 30 may adsorb a substrate S by static electricity. The electrostatic chuck 30 may be attached to the substrate S using static electricity. As a positive ('+') or negative ('−') potential is applied, the electrostatic chuck 30 may accordingly be charged with a '+' or '−' potential such that a force that pulls the substrate S is generated and the substrate S is attached to the electrostatic chuck 30. A film type electrostatic chuck 30 may have a flexible characteristic such that the electrostatic chuck 30 may be curved according to the curve of the sheet 10 attached thereto.

The metal mask 20 may be provided below the electrostatic chuck 30. A mask frame 25 and an edge portion of the metal mask 20 may be coupled to each other and an opening having a predetermined pattern may be formed in the metal mask 20. The substrate S may be mounted on the upper surface of the metal mask 20. The mask frame 25 may be provided above a mask stage 27. The mask stage 27 may be mounted on a support member 29 fixed to an inner wall of the vacuum deposition chamber 5. The metal mask 20 may be a fine metal mask (FMM).

The transfer members 16 may be coupled to the side surfaces of the sheet frame 15. The transfer members 16 may flatten the sheet 10 by pulling the sheet frame 15 to lateral side directions. Each transfer member 16 may include a ball screw 12 coupled to a side surface of the sheet frame 15 and a motor 14 coupled with the ball screw 12 to rotate the ball screw 12. The motor 14 and the ball screw 12 may both be provided in the vacuum deposition chamber 5. In some implementations, the motor 14 may be provided outside of the vacuum deposition chamber 5 and the ball screw 12 may be provided inside the vacuum deposition chamber 5.

FIG. 1 illustrates a state in which the substrate S is mounted on the metal mask 20 before being aligned, and the substrate S is curved convexly downward together with the metal mask 20 due to the weight of the substrate S. In such a state, the sheet 10 may be attached to the metal mask 20 together with the electrostatic chuck 30. The sheet 10, the electrostatic chuck 30, and the substrate S may be pulled to be flattened by the transfer members 16. As the magnetic plate 40 moves toward the metal mask 20, the metal mask 20 may be flattened by a magnetic force of the magnetic plate 40 such that the substrate S and the electrostatic chuck 30 are more closely attached to each other.

The magnetic plate 40 may be provided above the sheet 10. The metal mask 20 may attach the substrate S to the electrostatic chuck 30 by the magnetic force of the magnetic plate 40. The magnetic plate 40 may be connected with a magnetic plate driver 45 provided at an outer side of the vacuum deposition chamber 5 and such that the magnetic plate may be moved in an upward or downward direction. The magnetic plate 40 may be a permanent magnet, or may be a metal piece that may be used as an electromagnet by flowing a current thereto.

When the magnetic plate 40 is used as an electromagnet, intensity of the magnetic force may be controlled by adjusting the amount of current flowing to the electromagnet.

Figure 2:
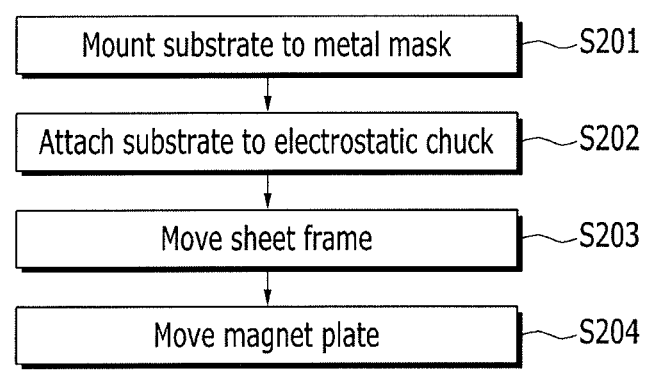
FIG. 2 illustrates a flowchart of a substrate aligning method according to the exemplary embodiment.

FIG. 2 illustrates a flowchart of a substrate aligning method according to an exemplary embodiment, and FIG. 3A to FIG. 3D illustrate process cross-sectional views of stages of a substrate aligning method according to the exemplary embodiment.

Referring to FIG. 2 and FIGS. 3A to 3D, a substrate aligning method according to the exemplary embodiment includes substrate mounting S201, substrate attachment S202, sheet frame movement S203, and magnetic plate movement S204.

Figure 3A:
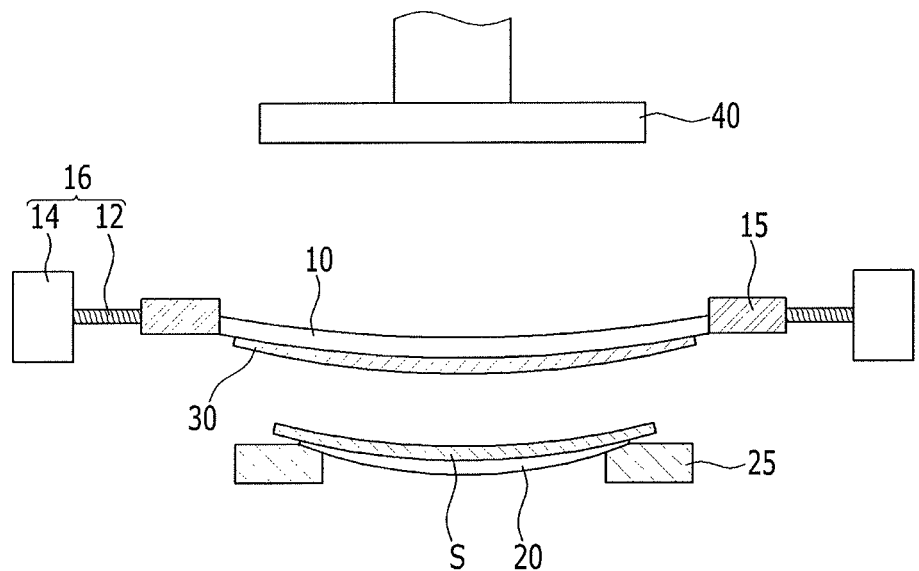
FIG. 3A to FIG. 3D illustrate process cross-sectional views of the substrate aligning method according to the exemplary embodiment.

First, referring to FIG. 3A, in the substrate mounting S201, the substrate S may be carried into the vacuum deposition chamber 5 and may be mounted to the metal mask 20. An edge portion of the metal mask 20 may be coupled with the mask frame 25. The substrate S may be formed of large-sized glass and may bend convexly in a downward direction together with the metal mask 20 due to the weight of the substrate S.

Figure 3B:
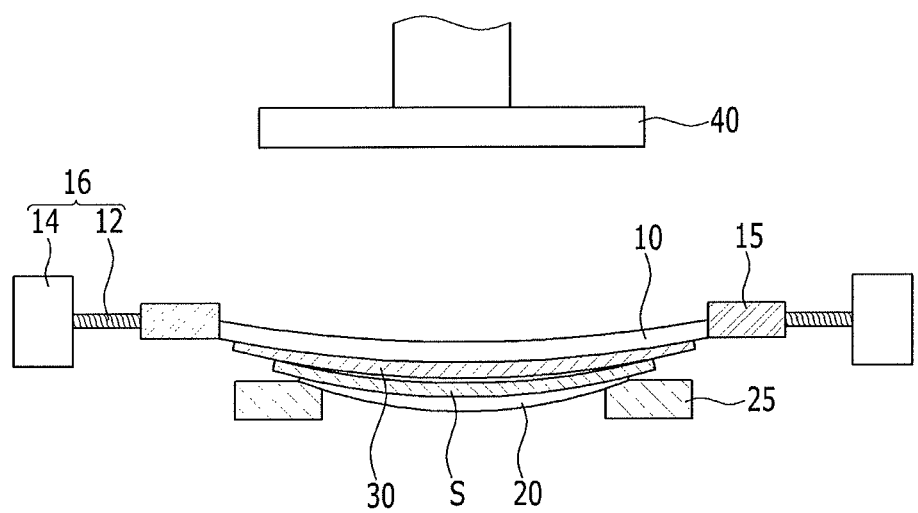

Next, referring to FIG. 3B, in the substrate attachment S202, the electrostatic chuck 30 provided above the metal mask 20 may move the sheet 10 in a downward direction toward the metal mask 20 such that the substrate S is attached to the electrostatic chuck 30. An edge portion of the sheet 10 may be integrally combined with the sheet frame 15. The substrate S may be adhered to the bottom surface of the sheet 10. The substrate S is charged with a '+' or '−' potential as a '+' or '−' potential is applied thereto. A force that pulls the substrate S may be generated such that the substrate S is attached to the electrostatic chuck 30. The sheet frame 15 may be connected with the sheet driver 17, and the sheet 10 may be moved in a downward direction toward the metal mask 20 by a descending operation of the sheet driver 17.

Figure 3C:
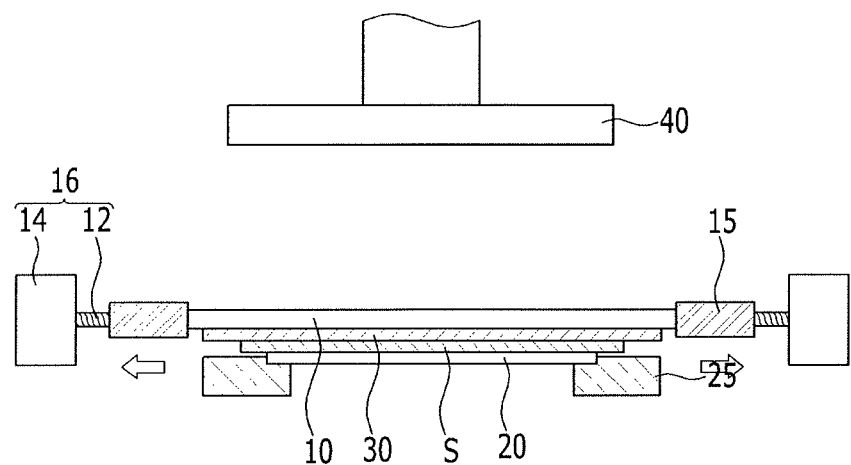

Next referring to FIG. 3C, in the sheet frame movement step S203, the sheet 10 to which the electrostatic chuck 30 is attached may be coupled to the metal mask 20, and the substrate S may be attached therebetween. In such a state, the transfer members 16 may be driven to move the sheet frames 15. As the sheet frames 15 move, the edges of the sheet 10 may be pulled to the outside such that the sheet 10, the electrostatic chuck 30, and the substrate S are flattened. The sheet frame 15 may be coupled to the ball screws 12 of the transfer members 16 such that the sheet frame 15 may horizontally move. The ball screws 12 may be coupled to the motors 14 so that the ball screws 12 may rotate. When the sheet 10 is coupled to the metal mask 20, while interposing the substrate S and the electrostatic chuck 30 therebetween and the motor 14 is driven to rotate the ball screw 12, the sheet frame 15 coupled to the ball screw 12 moves in an outward direction to pull the substrate S such that the substrate S becomes flattened. The degree of flatness of the substrate S may be thereby improved.

Figure 3D:
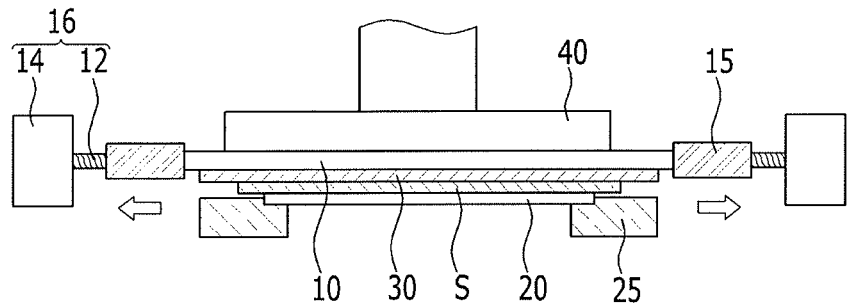
Figure 4A:
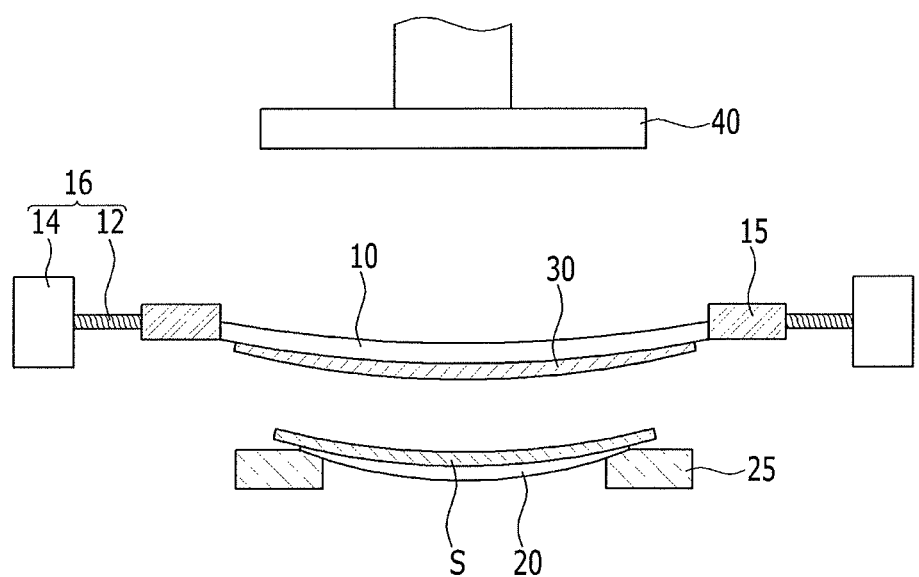
FIG. 4A to FIG. 4E illustrate process cross-sectional views of a substrate aligning method according to another exemplary embodiment.
Figure 4B:
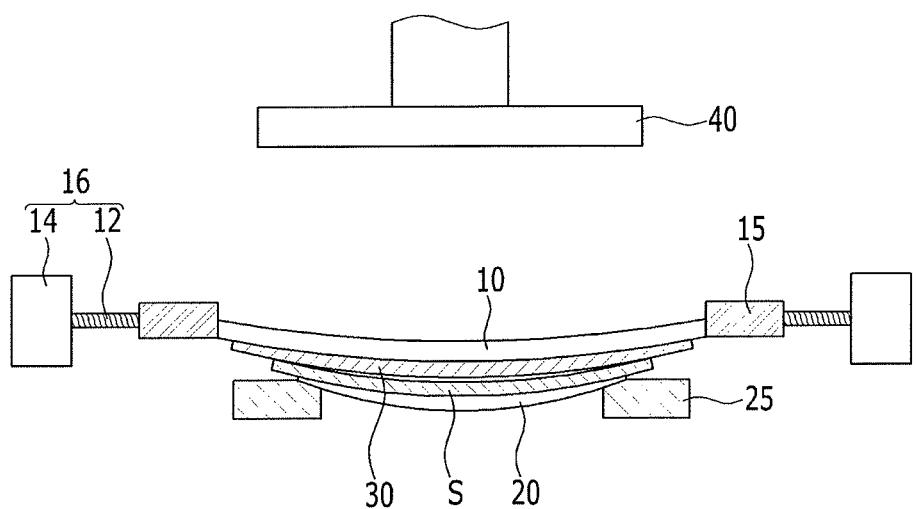
Figure 4C:
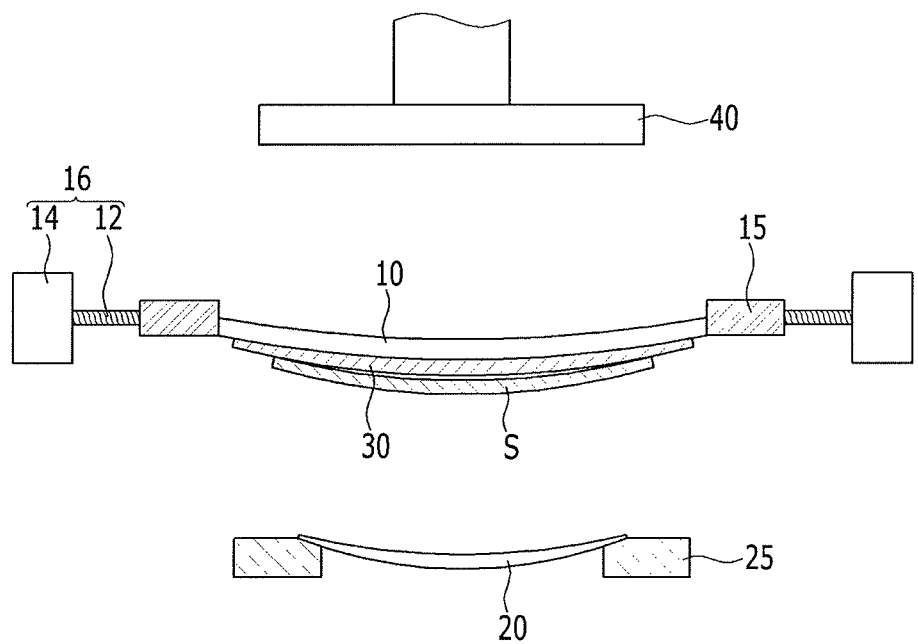
Figure 4D:
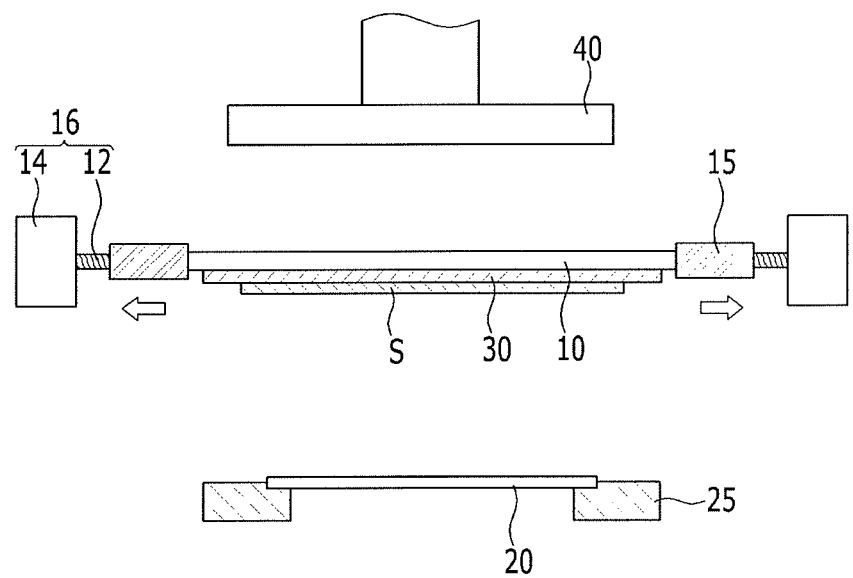
Figure 4E:
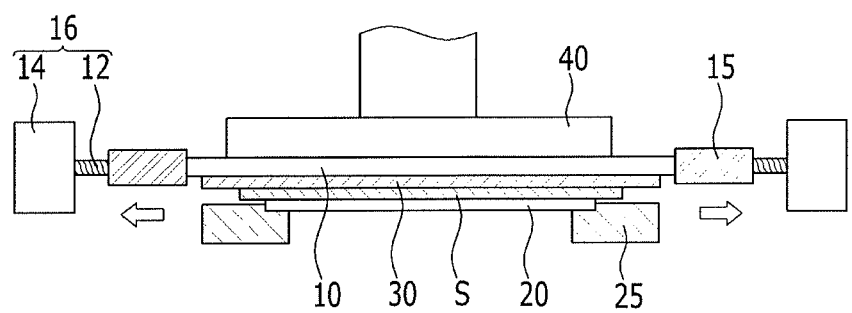

Next, referring to FIG. 3D, in the magnetic plate movement S204, the magnetic plate 40 provided above the sheet 10 may be moved in a downward direction toward the metal mask 20 such that the substrate S is attached to the metal mask 20. While the sheet 10, the electrostatic chuck 30, and the substrate S are pulled to be flattened, the metal mask 20 may be attached to the upper surface of the sheet 10 and the substrate S may be attached to the metal mask 20 by the magnetic force. Accordingly the degree of flatness of the substrate S may be further improved.

FIG. 4A to FIG. 4E illustrate process cross-sectional views of stages of a substrate aligning method according to another exemplary embodiment.

Referring to FIG. 4A to FIG. 4E, a substrate aligning method according to the present exemplary embodiment includes mounting a substrate S to a metal mask 20 of which an edge portion is coupled with a mask frame 25, attaching the substrate S to an electrostatic chuck 30 by moving a sheet 10, of which edge portions are integrally coupled with sheet frames 15 and to which the electrostatic chuck 30 is attached, in a downward direction toward the metal mask 20, moving the sheet 10 in an upward direction while the substrate S is being attached to the electrostatic chuck 30, flattening the sheet 10, the electrostatic chuck 30, and the substrate S by moving the sheet frame 15 to pull the edge portions of the sheet 10 to the outside the sheet 10, and a moving the magnetic plate 40 provided above the sheet 10 to closely attach the substrate S to the metal mask 20 using a magnetic force.

Unlike the substrate aligning method of the previous exemplary embodiment, the substrate aligning method of the present exemplary embodiment further includes moving the sheet 10 upward while the substrate S is being attached to the electrostatic chuck 30. In addition, while the electrostatic chuck 30, the substrate S, and the sheet 10 are moved in an upward direction, the sheet frames 15 are moved outwardly toward lateral sides to flatten the electrostatic chuck 30, the substrate S, and the sheet 10. Then, the magnetic plate 40 provided above the sheet 10 is moved in a downward direction toward the metal mask 20 to attach the magnetic plate 40 to the metal mask 20 together with the electrostatic chuck 30, the substrate S, and the sheet 10 such that the substrate S is attached to the metal mask 20 by the magnetic force of the magnetic plate 40. For example, in the previous exemplary embodiment, while the electrostatic chuck 30, the substrate S, and the sheet 10 are closely attached to the metal mask 20, the sheet frame 15 is pulled from lateral sides to flatten the substrate S. In the present exemplary embodiment, while the electrostatic chuck 30, the substrate S, and the sheet 10 are located in a space between the magnetic plate 40 and the metal mask 20, the sheet frame 15 is pulled from lateral sides to flatten the sheet frame 15. Then, the electrostatic chuck 30, the substrate S, and the sheet 10 are closely attached to the metal mask 20 together with the magnetic plate 40 as the magnetic plate 40 moves in a downward direction. Other processes of the present exemplary embodiment may be the same as those of the previous exemplary embodiment, and therefore a repeated description will not be repeated.

Figure 5:
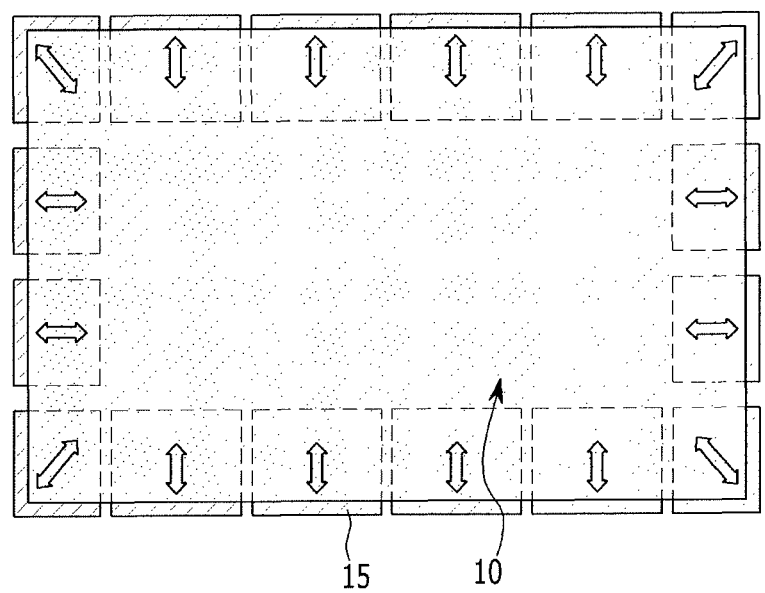
FIG. 5 illustrates a movement state of a sheet frame according to an exemplary embodiment.

FIG. 5 illustrates a state of movement of a sheet frame according to an exemplary embodiment. Referring to FIG. 5, a sheet frame 15 may be provided in plural, and each sheet frame 15 may be attached to one of a plurality of spots in an edge portion of the sheet 10. Each of the sheet frames 15 may be integrally coupled with the edge portion of the sheet 10. A group of sheet frames 15 at one side may move in the same direction toward the inside or outside with reference to the center portion of the sheet 10 such that the sheet 10 may be pulled from the outside, thereby flattening the sheet 10.

Figure 6:
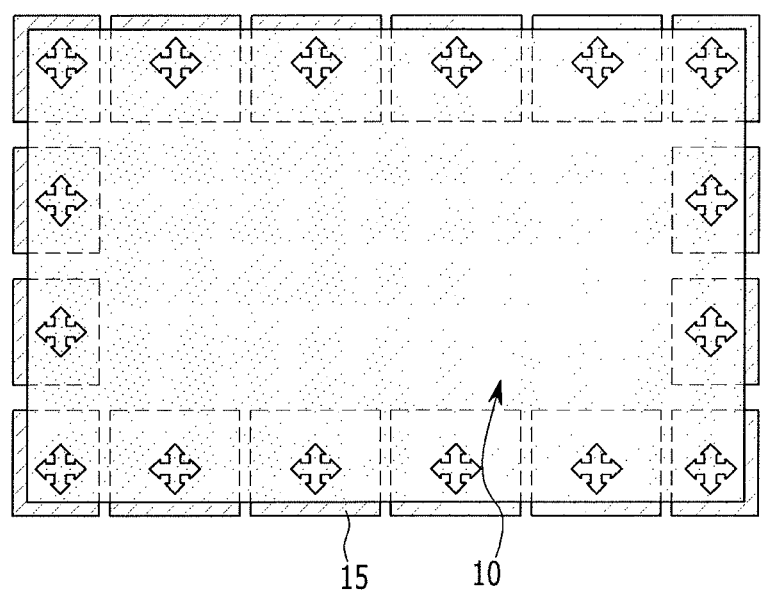
FIG. 6 illustrates a movement state of a sheet frame according to another exemplary embodiment.

FIG. 6 illustrates a state of movement of a sheet frame according to another exemplary embodiment. Referring to FIG. 6, a sheet frame 15 is provided in plural, and each of the sheet frames 15 is attached to one of a plurality of spots of an edge portion of the sheet 10. Each of the sheet frames 15 may be integrally coupled with the edge portion of the sheet 10, and each group of sheet frames 15 in each side may be freely movable in a plurality of directions, for example, toward the inside or the outside with respect to the center portion of the sheet 10.

Figure 7:
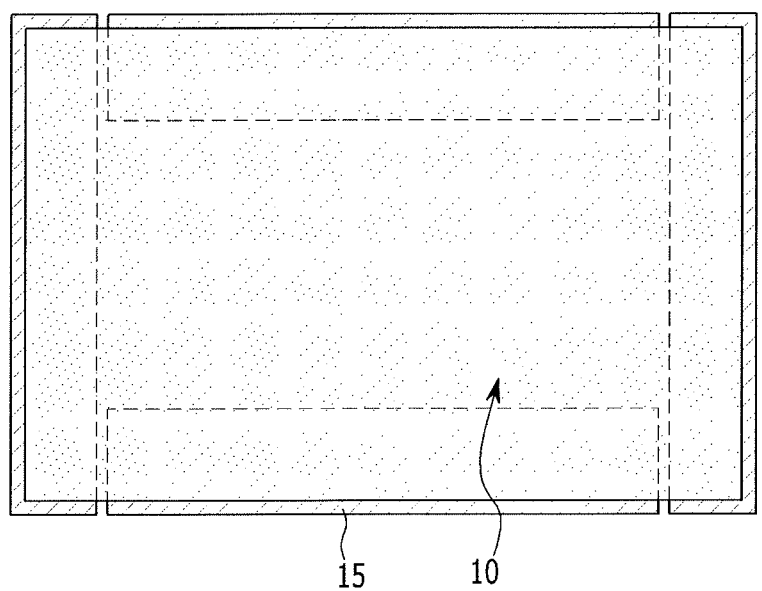
FIG. 7 illustrates a shape of a sheet frame according another exemplary embodiment.
Figure 8:
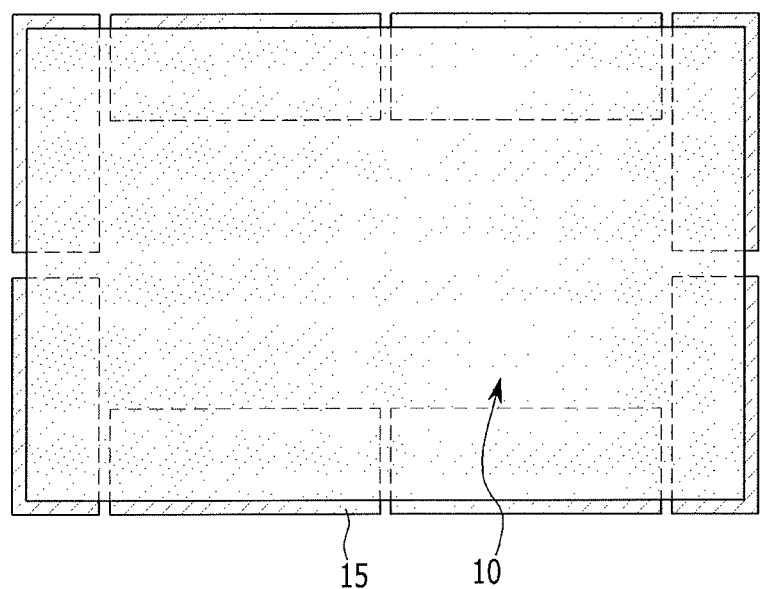
FIG. 8 illustrates a shape of a sheet frame according to another exemplary embodiment.

FIG. 7 and FIG. 8 respectively illustrate the shapes of sheet frames according to another exemplary embodiment. Referring to FIG. 7, a sheet frame 15 may be provided in the shape of a rectangle at each side of a sheet 10. In addition, as shown in FIG. 8, the sheet frame 15 may be provided in the shape of two or more rectangles in each side of the sheet 10.

Figure 9:
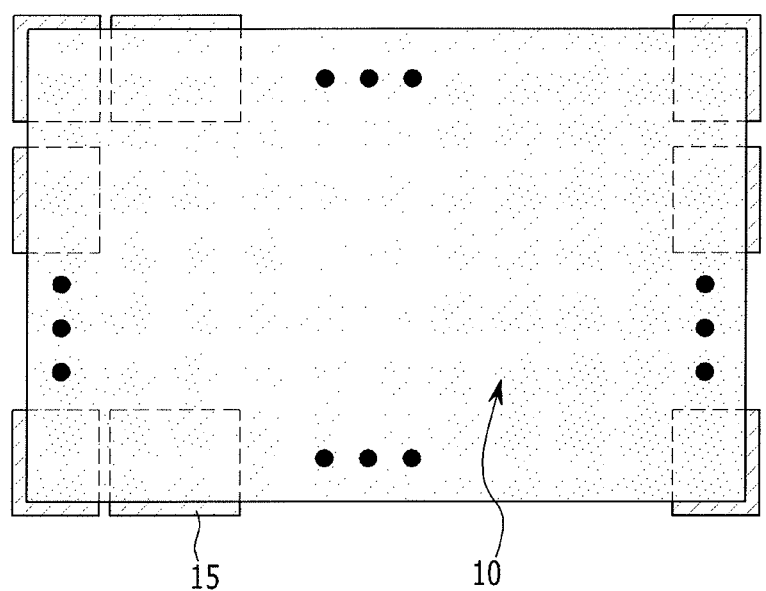
FIG. 9 illustrates a shape of a sheet frame according to another exemplary embodiment.

FIG. 9 illustrates the shape of a sheet frame according to another exemplary embodiment. Referring to FIG. 9, a sheet frame 15 provided in one side of a sheet 10 may be provided in plural, and each of the sheet frames 15 may have a different size.

As shown in FIG. 5 to FIG. 9, when the movement direction and the number of sheet frames 15 are adjusted, the sheet 10 may be freely pulled, thereby more improving the degree of flatness of the substrate S.

As described, according to the deposition apparatus and the substrate aligning method according to the exemplary embodiments, the substrate can be prevented from being slack during a deposition process so that a change in locations of hole patterns on a mask due to the slack substrate can be prevented, and accordingly deposition location accuracy can be improved and deposition failure can be reduced. In addition, as the deposition failure is decreased, productivity can be improved and production cost can be lowered. Further, as the deposition location accuracy is improved, a high-resolution deposition process can be performed.

By way of summation and review, in a deposition process for uniform deposition of a pattern with an accurate shape to a substrate in a thin film deposition apparatus, it is desirable to maintain a mask and a substrate in a closely attached state. If the deposition process is performed while the mask and the substrate are spaced apart from each other, a thin film deposition pattern may be non-uniformly formed rather than being formed with a uniform shape of a slit in the mask. For example, the shape of the thin film deposition pattern may be formed to be larger than the shape of the slit. In order to address the non-uniformity in shape, a cool plate may be provided above a substrate so as to attach the substrate to the mask by pushing the substrate toward the mask and pressing the substrate from above toward the mask during a deposition process.

However, when the substrate is pressed using the cool plate, a center portion of the substrate may be slack compared to edges of the substrate even though the degree of slack in the substrate is reduced to some degree by gravity.

When a cool plate is used, the substrate pressed from above by the cool plate may not be completely flattened. For example, in an experiment, a glass substrate having a thickness of 0.4 mm, a width of 750 mm, and a height of 650 mm was found to be slack until the substrate is pressed about 340 µm using a cool plate.

When a substrate is slack, a location of a hole pattern on a mask that is provided below the substrate and contacts the substrate may be changed. When the mask is provided in its designed location, hole patterns may be located at their designed locations on the mask. However, when a mask is pressed by the substrate that is slack in a downward direction, the locations of the hole patterns may be changed.

As the locations of the hole patterns on the mask are changed, a location of a deposition material deposited to the substrate may be changed, thereby causing a deposition failure. Particularly, the deposition location change due to the slack substrate may cause a more critical deposition failure in a deposition process of a high-resolution product. Accordingly, such a problem should be addressed in manufacturing of a high-resolution product through deposition.

Embodiments advance the art by providing a deposition apparatus that may reduce the degree of slack in the substrate using an electrostatic chuck in installation of a substrate, and a method for aligning the substrate in the deposition apparatus.

According to the deposition apparatus and the substrate aligning method in the deposition apparatus of the exemplary embodiments, the substrate may be prevented from being slack. Accordingly, a change in locations of hole patterns on the mask due to the slack in the substrate may be prevented, thereby improving deposition location accuracy and reducing deposition failure. As the deposition failure is decreased, productivity can be improved and production cost can be lowered. As the deposition location accuracy is improved, a high-resolution deposition process can be performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A deposition apparatus, comprising:
    a sheet, an edge portion of which is integrally combined with a sheet frame;
    an electrostatic chuck attached to a bottom surface of the sheet, the electrostatic chuck adhering a substrate by a force of static electricity;
    a metal mask located below the electrostatic chuck, an edge portion of the metal mask being combined with a mask frame, the metal mask having a predetermined patterned opening, and the substrate being mounted to the upper surface of the metal mask;
    a transfer member coupled to a side surface of the sheet frame, the transfer member flattening the sheet by pulling the sheet to side directions; and
    a magnetic plate located above the sheet, the magnetic plate closely attaching the substrate to the electrostatic chuck by pulling the metal mask using a magnetic force.

2. The deposition apparatus as claimed in claim 1, further comprising:
    a sheet frame driver that transfers the sheet frame in an upward or downward direction; and
    a magnetic plate driver that transfers the magnetic plate in an upward or downward direction.

3. The deposition apparatus as claimed in claim 1, wherein the electrostatic chuck is in a form of a film.

4. The deposition apparatus as claimed in claim 1, wherein the sheet and the electrostatic chuck attached to the sheet are bent convexly in a downward direction.

5. The deposition apparatus as claimed in claim 1, wherein the sheet is made of a metal or a polymer material.

6. The deposition apparatus as claimed in claim 1, wherein the magnetic plate is a permanent magnet or an electromagnet.

7. The deposition apparatus as claimed in claim 1, wherein the metal mask is a fine metal mask.

8. The deposition apparatus as claimed in claim 1, wherein the transfer member includes:
    a ball screw rotatably coupled to a side surface of the sheet frame; and
    a motor coupled to the ball screw to rotate the ball screw.

9. The deposition apparatus as claimed in claim 1, wherein the sheet frame is provided as plural sheet frames, which are each attached to one of a plurality of spots of an edge portion of the sheet.

10. The deposition apparatus as claimed in claim 9, wherein each of the sheet frames is moveable in a plurality of directions.

11. The deposition apparatus as claimed in claim 9, wherein each of the sheet frames has a different size.

12. A substrate aligning method, comprising:
    mounting a substrate to a metal mask, an edge portion of the metal mask being combined with a mask frame;
    attaching the substrate to an electrostatic chuck by moving a sheet to which the electrostatic chuck is attached in a direction toward the metal mask, the sheet including an edge portion integrally combined with a sheet frame;
    flattening the sheet, the electrostatic chuck, and the substrate by moving the sheet frame to pull the edge portion of the sheet in an outward direction; and
    moving a magnetic plate located above the sheet in a downward direction toward the metal mask to closely attach the substrate to the metal mask using a magnetic force.

13. A substrate aligning method, comprising:
    mounting a substrate to a metal mask, an edge portion of the metal mask being combined with a mask frame;
    attaching the substrate to an electrostatic chuck by moving a sheet to which the electrostatic chuck is attached in a downward direction toward the metal mask, an edge portion of the sheet being integrally combined with a sheet frame;
    moving the sheet in an upward direction while the substrate is attached to the electrostatic chuck;
    flattening the sheet, the electrostatic chuck, and the substrate by moving the sheet frame to pull the edge portion of the sheet in an outward direction; and
    closely attaching the substrate to the metal mask using a magnetic force by moving a magnetic plate located above the sheet in a downward direction toward the metal mask.

* * * * *